United States Patent [19]
Pierret

[11] Patent Number: 5,568,090
[45] Date of Patent: Oct. 22, 1996

[54] AMPLIFIER CIRCUIT WITH DYNAMIC OUTPUT STAGE BIASING

[75] Inventor: Joseph R. Pierret, San Jose, Calif.

[73] Assignee: Elantec, Inc., Milpitas, Calif.

[21] Appl. No.: 506,529

[22] Filed: Jul. 25, 1995

[51] Int. Cl.[6] .............................. H03F 3/45; H03F 3/30
[52] U.S. Cl. ...................... 330/255; 330/259; 330/267
[58] Field of Search ............................ 330/255, 259, 330/265, 267, 268, 273, 274

[56] References Cited

U.S. PATENT DOCUMENTS

| | | | |
|---|---|---|---|
| 4,316,149 | 2/1982 | Yamaguchi | 330/255 X |
| 4,454,479 | 6/1984 | Spires | 330/265 X |
| 4,471,322 | 9/1984 | Yamaguchi et al. | 330/267 |
| 5,166,636 | 11/1992 | Bien | 330/255 |
| 5,168,243 | 12/1992 | Feliz et al. | 330/257 X |
| 5,389,894 | 2/1995 | Ryat | 330/255 |

*Primary Examiner*—James B. Mullins
*Attorney, Agent, or Firm*—Fliesler Dubb Meyer & Lovejoy

[57] ABSTRACT

An amplifier circuit is disclosed having circuitry that senses an electrical current at the output node while dynamically adjusting a bias current for an output circuit of the amplifier circuit. The bias current controls the amount of electrical current that the output circuit sinks or sources at the output node.

19 Claims, 5 Drawing Sheets

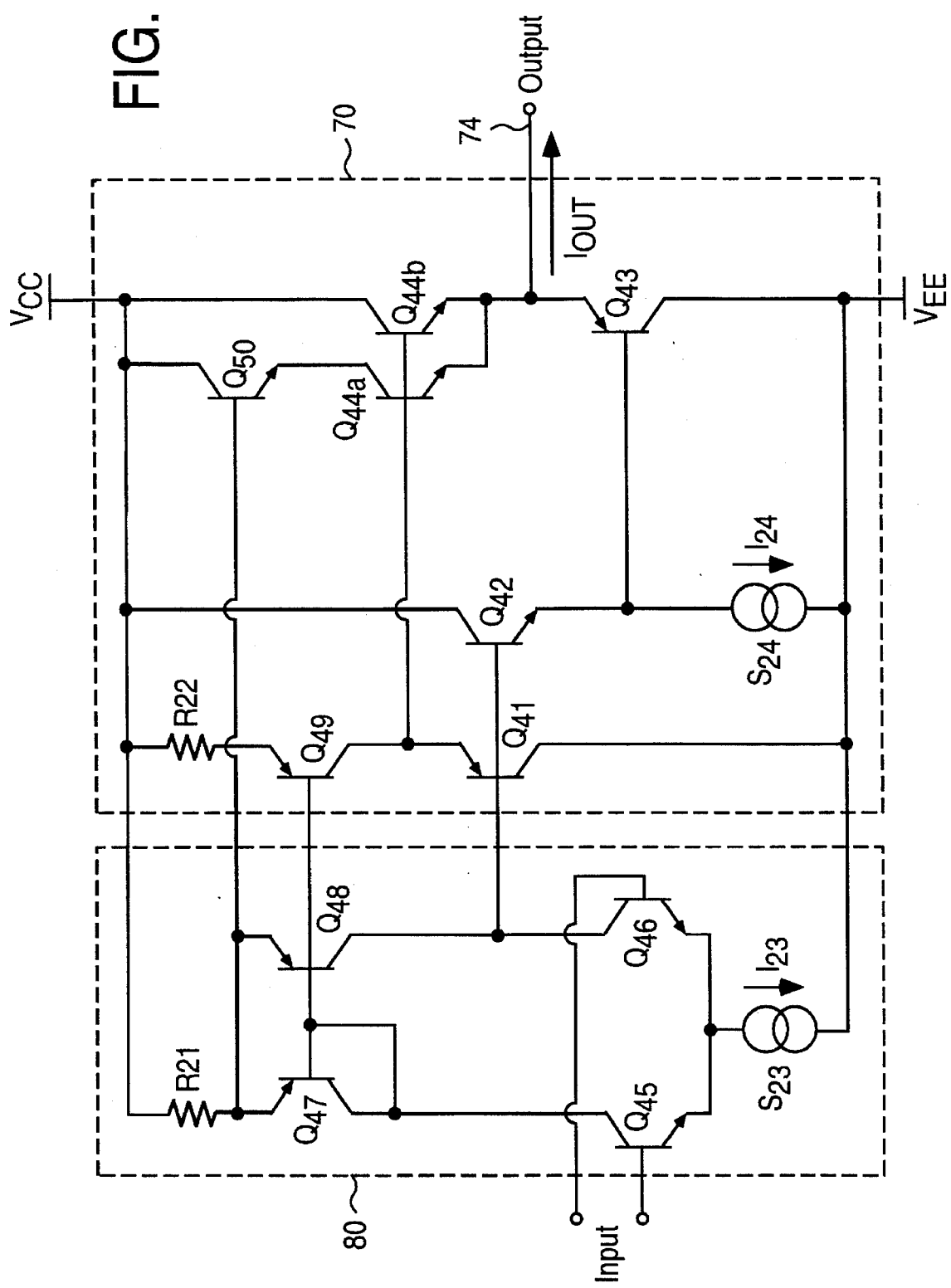

AMPLIFIER CIRCUIT WITH DYNAMIC OUTPUT STAGE BIASING

BACKGROUND OF THE INVENTION

1. Field of the Invention

The present invention pertains to the field of integrated circuits. More particularly, this invention relates to an amplifier circuit that employs dynamic output stage biasing for enhanced output current drive capability.

2. Art Background

FIG. 1 illustrates a typical prior operational amplifier circuit having a gain stage 10 and an output stage 12. The output stage 12 operates in the CLASS AB mode. The output stage 12 comprises a set of transistors $Q_1$ through $Q_4$ and a pair of electrical current sources S1 and S2. The electrical current source S1 supplies an electrical current $I_1$ to the base of the transistor $Q_3$. Similarly, the electrical current source S2 supplies an electrical current $I_2$ to the base of the transistor $Q_4$.

The output stage 12 sinks an electrical load current $I_{OUT}$ into an output node 14 in the direction shown. As the magnitude of the electrical current $I_{OUT}$ increases due to external loading factors, the base of the transistor $Q_4$ requires increasing amounts of electrical current from the current source S2 to meet the increased demand.

In addition, the amount of electrical current flowing through the emitter of the transistor $Q_1$ decreases as the base of the transistor $Q_4$ draws increasing amounts of electrical current. Such a decrease in the amount of electrical current flowing through the emitter of the transistor $Q_1$ is a direct consequence of the increased demand for I2 electrical current to the base of the transistor $Q_4$ to satisfy the changing demands of external load at the output node 14.

Unfortunately, the amount of electrical current available to the base of the transistor $Q_4$ reaches an upper limit as the decreasing amount of electrical current flowing through the emitter of the transistor $Q_1$ reaches zero. Moreover, the amount of electrical output current $I_{OUT}$ sinking into the output node 14 cannot be increased once the electrical current flow through the emitter of the transistor $Q_1$ reaches zero. The upper limit on maximum output current sinking at the output node 14 is given by $$I_{OUT} (max) = (B_{p+1}) * I_2$$

where $B_p$ is the electrical current gain of the transistor $Q_4$. The electrical current gain of the transistor $Q_4$ is given by $$B_F = I_C / I_B$$

where $I_C$ is the collector current through the transistor $Q_4$ and where $I_B$ is the base current of the transistor $Q_4$.

Moreover, temperature variations of the output stage 12 along with process control variations during device manufacture typically cause a wide variation in the actual values of $B_P$ among differing devices. As a consequence, the amount of electrical current $I_{OUT}$ that the output stage 12 can sink at the output node 14 is limited by low values of $B_P$ for the transistor $Q_4$.

One prior approach to overcoming such a limitation on the electrical current $I_{OUT}$ is to increase the amount of electrical current $I_2$ supplied from the current source S2. Unfortunately, such an augmented current source increases the amount of DC electrical power consumption of the output stage 12, and thereby increases the power consumption of any system that employs such an operational amplifier.

SUMMARY AND OBJECTS OF THE INVENTION

One object of the present invention is to provide an output stage of an amplifier circuit that increases the output current drive capability of the amplifier circuit.

Another object of the present invention is to enhance the output drive capability of an amplifier circuit while minimizing DC power consumption of the amplifier circuit.

These and other objects of the invention are provided by an amplifier circuit having an output circuit that sinks or sources an electrical current at an output node and circuitry that senses the electrical current at the output node while dynamically adjusting a bias current that controls the amount of electrical current that the output circuit sinks or sources at the output node.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which:

FIG. 5 illustrates an alternative embodiment of the amplifier circuit shown in FIG. 3.

DETAILED DESCRIPTION

Figure 1:
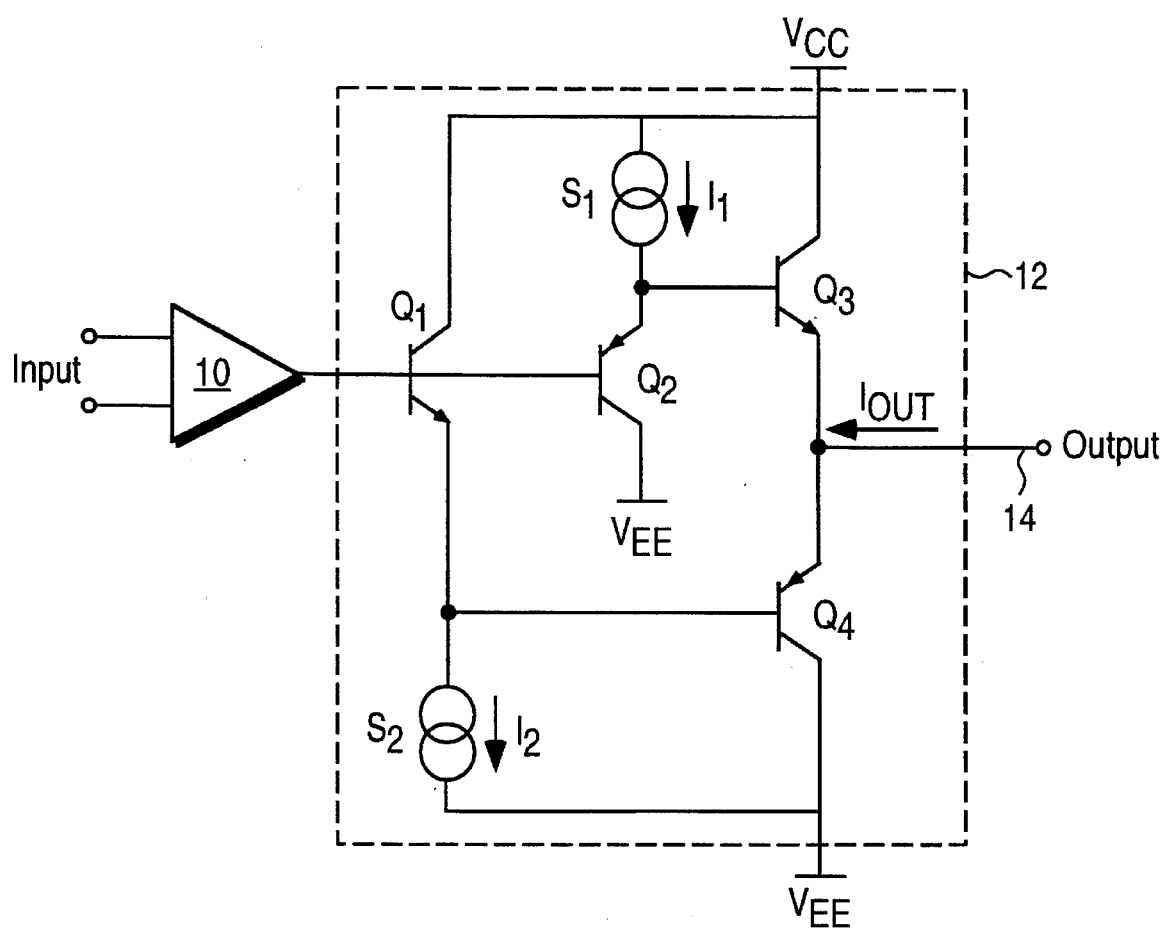
FIG. 1 illustrates a typical prior operational amplifier circuit including an amplifier stage and an output stage.
Figure 2:
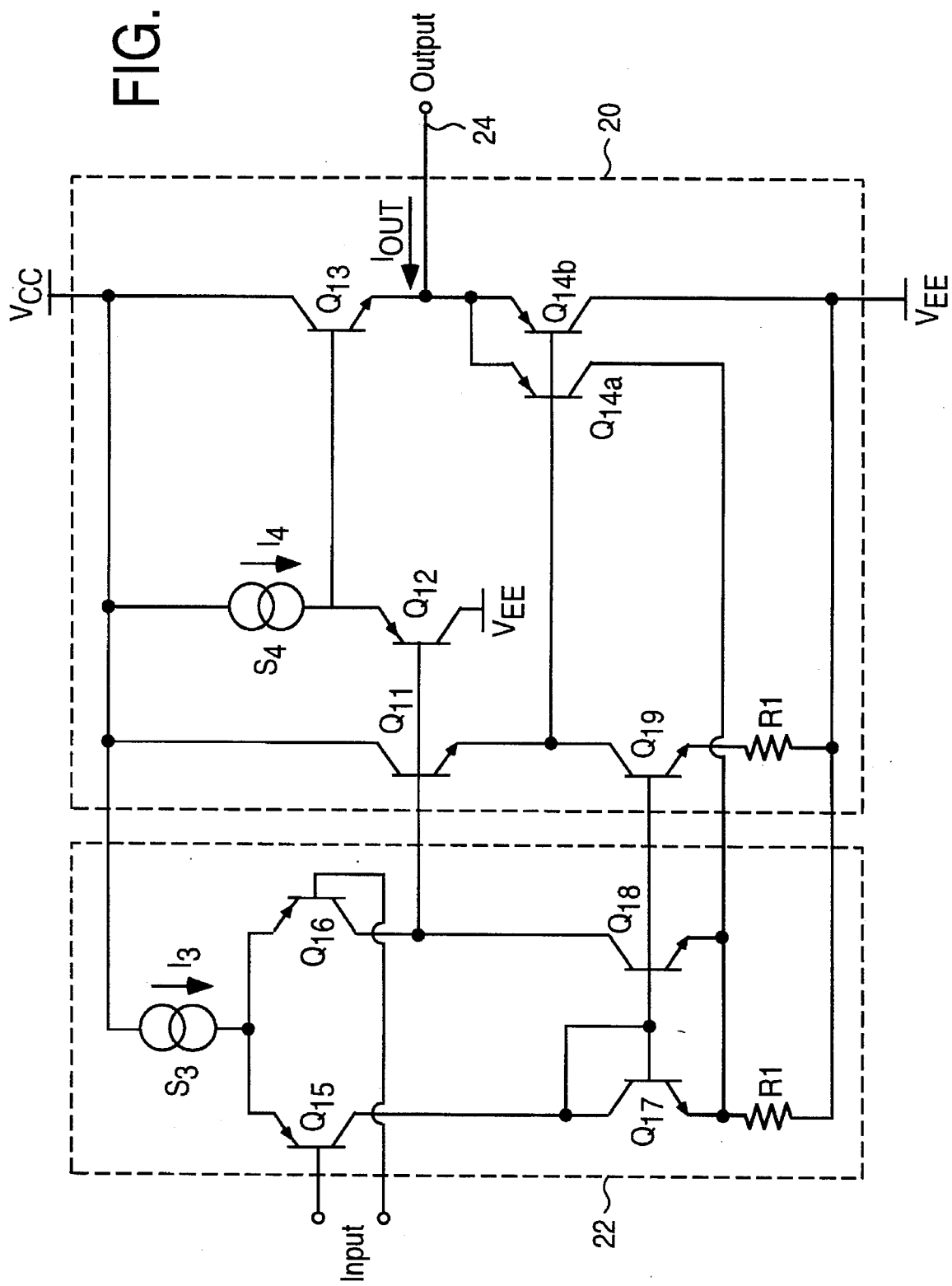
FIG. 2 illustrates an operational amplifier circuit that employs dynamic output stage biasing for one embodiment.

FIG. 2 illustrates an amplifier circuit including circuitry for dynamic output stage biasing. The amplifier circuit comprises a gain stage 22 and an output stage 20. For one embodiment, the gain stage 22 together with the output stage 20 form the final stage of a two-stage operational amplifier.

The gain stage 22 includes a set of transistors $Q_{15}$ through $Q_{18}$, an electrical current source S3, and a resistor R1. The transistors $Q_{15}$ and $Q_{16}$ are arranged as a differential input pair for the gain stage 22. The transistors $Q_{17}$ and $Q_{18}$ form a current mirror load circuit in combination with the resistor R1.

The output stage 20 includes a set of transistors $Q_{11}$ through $Q_{13}$ and $Q_{14b}$ and an electrical current source S4 that supplies an electrical current $I_4$. The electrical output current $I_{OUT}$ at an output node 24 sinks through the transistors $Q_{14a}$ and $Q_{14b}$. The transistor $Q_{14a}$ in combination with a transistor $Q_{19}$ and a resistor R2 provide dynamic output stage biasing for the output stage 20.

The dynamic output stage biasing occurs as the electrical current flow $I_{OUT}$ into the output node 24 increases while the external demand on output sink current increases. A portion of the electrical current $I_{OUT}$ is sensed through the collector of the transistor $Q_{14a}$. The increase in sensed electrical current at the collector of the transistor $Q_{14a}$ is transferred to the resistor R1 which increases the voltage at the emitter of the transistor $Q_{17}$. The increase in voltage at the emitter of the transistor $Q_{17}$ in turn increases the voltage at the base of the transistor $Q_{17}$, as well as at the base of the transistor $Q_{18}$ and the base of the transistor $Q_{19}$.

The increase in the voltages at the bases of the transistors $Q_{17}$, $Q_{18}$ and $Q_{19}$ caused by the increase in the electrical current $I_{OUT}$ at the output node 24 causes an increase in the amount of electrical current flow through the transistor $Q_{19}$. Such increased electrical current flow through the transistor $Q_{19}$ supplies electrical current to the bases of the transistors $Q_{14a}$ and $Q_{14b}$ as needed while the electrical current $I_{OUT}$ increases. Excess electrical current that flows through the collector of the transistor $Q_{19}$ is shunted away to the supply voltage $V_{cc}$ through the transistor $Q_{11}$.

Consider only the electrical currents in the gain stage 22 and the output stage 20 that are caused by load current flow at the node 24. As the load current $I_{OUT}$ is sinking into the emitters of the transistors $Q_{14a}$ and $Q_{14b}$, the base currents flowing out of the bases of the transistors $Q_{14a}$ and $Q_{14b}$ is given by the following equation (equation #1):

$$\Delta IB(Q_{14_{ab}}) = \frac{I_{out}}{B_p + 1}$$

where $B_P$ is the PNP current gain $=_C \div I_B$.

An analysis of equation #1 reveals that if an electrical current is provided to the bases of the transistors $Q_{14a}$ and $Q_{14b}$ that is proportional to $B_P +1$, then the excess current that is wasted into the transistor $Q_{11}$ would be further minimized.

Consider the type of material of which the resistor R2 is constructed. In one embodiment, the resistor R2 is an N-pinch resistor. An N-pinch resistor is constructed of the similar material as the base-emitter structure of a PNP transistor and is known to track $B_P$. Let K be a constant that represents the area ratio of the emitter of the transistor $Q_{14b}$ to the emitter of the transistor $Q_{14a}$. If the NPN base currents are ignored, then the current provided by the collector of the transistor $Q_{19}$ is proportional to the collector current of the transistor $Q_{14a}$ and is given by the following equation (equation #2):

$$\Delta IC(Q19) = \frac{R1}{R2} \times \Delta IC(Q_{14_a})$$

where the term $\Delta IC(Q_{14b})$ is given by the following (equation #3 ):

$$\Delta IC(Q_{14_a}) = \frac{I_{out}}{K+1} \times \frac{B_p}{B_p+1}$$

and where R2 is given by the following (equation #4):

R2=R'2×$B_P$ where R'2 is a constant and not proportional to $B_P$. Substituting equations #3 and #4 into equation #2, yields the following (equation #5):

$$\Delta IC(Q9) = \frac{R1}{R'2} \times \frac{I_{out}}{K+1} \times \frac{1}{B_p+1}$$

A comparison of equations #1 and #5, reveals that both equations are proportional to $B_P+1$ and thus a further minimization of the excess current wasted to the transistor $Q_{11}$ and the $V_{CC}$ supply is achieved. In practice, the resistor R1 is chosen to be of a type that is well-controlled in the particular process technology used to fabricate the circuitry shown.

Figure 3:
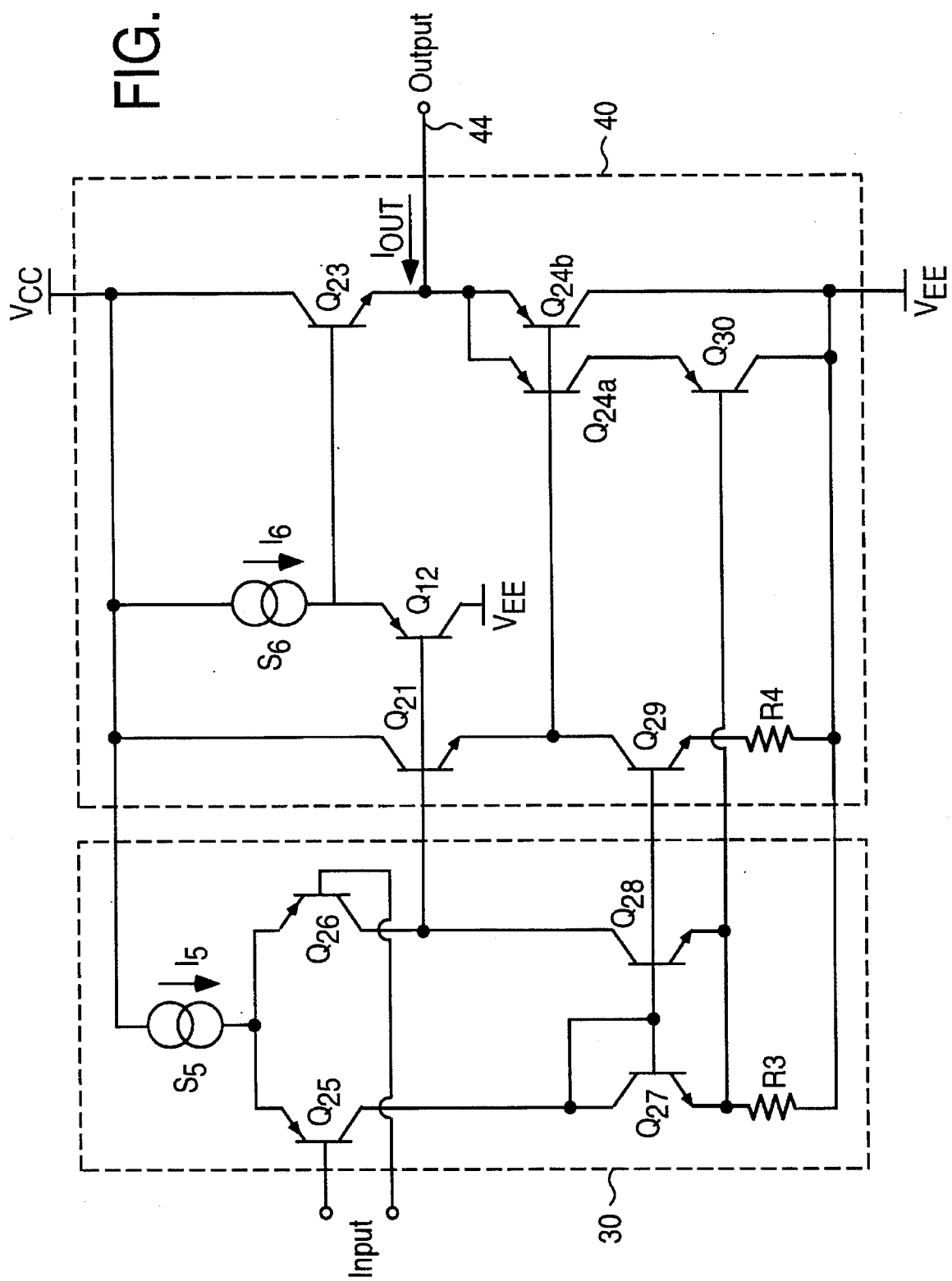
FIG. 3 illustrates another operational amplifier circuit that employs dynamic output stage biasing for another embodiment.

FIG. 3 shows another embodiment of an amplifier circuit that employs dynamic output stage biasing. This embodiment of the amplifier circuit includes a gain stage 30 and an output stage 40. The gain stage 30 includes a pair of transistors $Q_{25}$ and $Q_{26}$ arranged as a differential input pair, and a pair of transistors $Q_{27}$ and $Q_{28}$ that form a current mirror load circuit in combination with the resistor R3.

The output stage 40 includes a set of transistors $Q_{21}$ through $Q_{23}$ and $Q_{24b}$ and an electrical current source S6 that supplies an electrical current $1_6$. The electrical output current $I_{OUT}$ sinks to the output stage 40 at an output node 44. The transistors $Q_{24a}$ and $Q_{30}$ in combination with a transistor $Q_{29}$ and a resistor R4 provide dynamic output stage biasing for the output stage 40.

As the electrical current flow $I_{OUT}$ into the output node 44 increases, a portion of the electrical current $I_{OUT}$ is sensed through the collector of the transistor $Q_{24a}$. A transistor $Q_{30}$ feeds back a proportional base electrical current to the resistor R3. The electrical current fed back to the resistor R3 is in direct proportion to the base electrical currents required by the transistors $Q_{24a}$ and $Q_{24b}$.

The increased in sensed electrical current indicated at the base of the transistor $Q_{30}$ is transferred to the resistor R3 which increases the voltage at the emitter of the transistor $Q_{27}$. This in turn increases the voltage at the base of the transistor $Q_{27}$ and the bases of the transistors $Q_{28}$ and $Q_{29}$. The increase in the voltages at the bases of the transistors $Q_{27}$, $Q_{28}$ and $Q_{29}$ causes an increase in the amount of electrical current flow through the transistor $Q_{29}$ which supplies electrical current to the bases of the transistors $Q_{24a}$ and $Q_{24b}$ as needed as the electrical current $I_{OUT}$ increases.

The physical dimensions of the transistors $Q_{24a}$, $Q_{24b}$ and the resistors R3 and R4 are chosen to provide the correct amount of dynamic bias supplied to the bases of the transistors $Q_{24a}$ and $Q_{24b}$.

Figure 4:
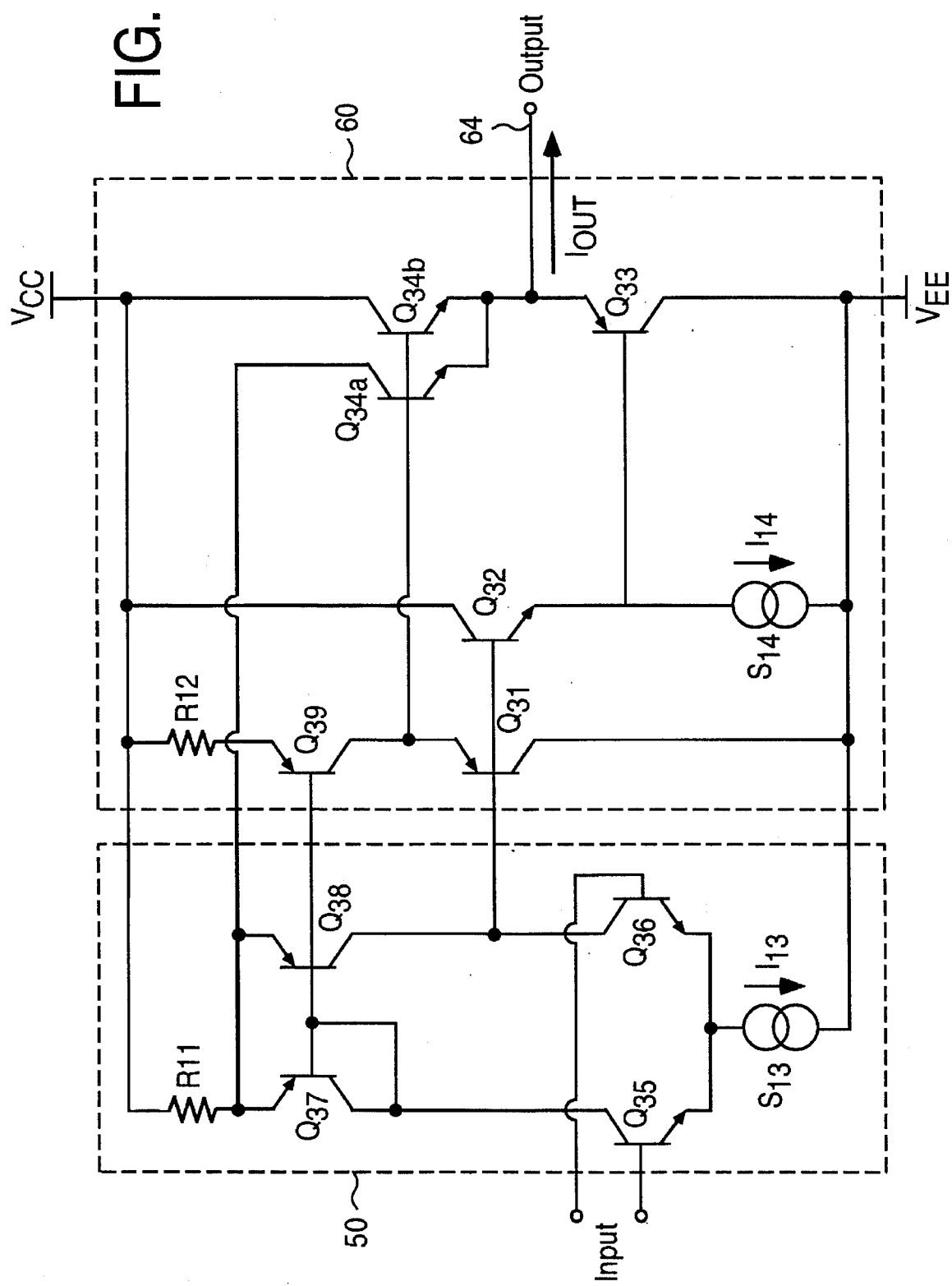
FIG. 4 illustrates an alternative embodiment of the amplifier circuit shown in FIG. 2.

FIG. 4 illustrates an alternative embodiment of the amplifier circuit shown in FIG. 2. In this embodiment, electrical current flows are reversed wherein NPN transistors of FIG. 2 are replaced with PNP transistors in FIG. 4 and wherein PNP transistors of FIG. 2 are replaced with NPN transistors in FIG. 4.

The amplifier circuit in this embodiment includes a gain stage 50 and an output stage 60. The electrical output current $I_{OUT}$ at an output node 64 is supplied or "sources" through the transistors $Q_{34a}$ and $Q_{34b}$. The transistor $Q_{34a}$ in combination with a transistor $Q_{39}$ and a resistor R12 provide dynamic output stage biasing for the output stage 60. In this embodiment, the resistor R12 is a P-pinch resistor.

FIG. 5 shows an alternative embodiment of the amplifier circuit shown in FIG. 3. In this embodiment, electrical current flows are reversed wherein NPN transistors of FIG. 3 are replaced with PNP transistors in FIG. 5 and wherein PNP transistors of FIG. 3 are replaced with NPN transistors in FIG. 5.

This embodiment of the amplifier circuit includes a gain stage 80 and an output stage 70. The electrical output current $I_{OUT}$ sources from the output stage 70 at an output node 74. A set of transistors $Q_{44a}$, $Q_{44b}$ and $Q_{50}$ in combination with a transistor $Q_{49}$ and a resistor R22 provide dynamic output stage biasing for the output stage 70.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. An amplifier circuit, comprising:

gain stage having a current mirror load circuit including a first transistor with a base coupled to a base of a second transistor and including a first resister coupled to the emitters of each of the first and second transistors;

circuit that generates an output bias electrical current in response to the voltage on the bases of the first and second transistors;

output stage having an output transistor biased by the output bias electrical current and having a circuit that senses an output current at an output node and that feeds back a portion of the output current to the first resister such that the portion of the output current adjusts the voltage on the bases of the first and second transistors in the current mirror load circuit.

2. The amplifier circuit of claim 1, wherein the output stage further includes a shunt transistor that shunts away an excess amount of the output bias electrical current to a voltage supply node.

3. The amplifier circuit of claim 1, wherein the circuit that senses the output current comprises a feedback transistor coupled between the output node and the emitters of the first and second transistors in the current mirror load circuit.

4. The amplifier circuit of claim 1, wherein the circuit that senses the output current comprises a pair of transistors coupled between the output node and a voltage supply node and coupled to supply a control voltage to the emitters of the first and second transistors in the current mirror circuit.

5. The amplifier circuit of claim 1, wherein the circuit that generates an output bias electrical current comprises a third transistor and a second resister coupled between a base of the output transistor and a voltage supply node.

6. The amplifier circuit of claim 5, wherein the second resister comprises an N-pinch resister.

7. The amplifier circuit of claim 5, wherein the second resister comprises a P-pinch resister.

8. The amplifier circuit of claim 1, wherein the output transistor sinks the output current at the output node.

9. The amplifier circuit of claim 1, wherein the output transistor sources the output current at the output node.

10. An amplifier circuit, comprising:

gain stage having a current mirror load circuit including a first transistor with a base coupled to a base of a second transistor and including a first resister coupled to the emitters of each of the first and second transistors;

output stage having a circuit that generates an output bias electrical current in response to the voltage on the bases of the first and second transistors and having and output transistor that sinks an output current at an output node and that is biased by the output bias electrical current, the output stage having a feedback current that senses the output current and that feeds back a portion of the output current to the first resister such that the portion of the output current adjusts the voltage on the bases of the first and second transistors.

11. The amplifier circuit of claim 10, wherein the output stage further includes a shunt transistor that shunts away an excess amount of the output bias electrical current to a voltage supply node.

12. The amplifier circuit of claim 10, wherein the feedback circuit comprises a pair of transistors coupled between the output node and a voltage supply node and coupled to supply a control voltage to the emitters of the first and second transistors in the current mirror circuit.

13. The amplifier circuit of claim 10, wherein the circuit that generates an output bias electrical current comprises a third transistor and a second resister coupled between a base of the output transistor and a voltage supply node.

14. The amplifier circuit of claim 13, wherein the second resister comprises an N-pinch resister.

15. An amplifier circuit, comprising:

gain stage having a current mirror load circuit including a first transistor with a base coupled to a base of a second transistor and including a first resister coupled to the emitters of each of the first and second transistors;

output stage having a circuit that generates an output bias electrical current in response to the voltage on the bases of the first and second transistors and having an output transistor that sources an output current at an output mode and that is biased by the output bias electrical current, the output stage having a feedback circuit that senses the output current and that feeds back a portion of the output current to the first resister such that the potion of the output current adjusts the voltage on the bases of the first and second transistors.

16. The amplifier circuit of claim 15, wherein the output stage further includes a shunt transistor that shunts away an excess amount of the output bias electrical current to a voltage supply node.

17. The amplifier circuit of claim 15, wherein the feedback circuit comprises a pair of transistors coupled between the output node and a voltage supply node and coupled to supply a control voltage to the emitters of the first and second transistors in the current mirror circuit.

18. The amplifier circuit of claim 15, wherein the circuit that generates an output bias electrical current comprises a third transistor and a second resister coupled between a base of the output transistor and a voltage supply node.

19. The amplifier circuit of claim 18, wherein the second resister comprises an P-pinch resister.

* * * * *